United States Patent
Balandier et al.

[11] Patent Number: 6,114,667
[45] Date of Patent: Sep. 5, 2000

[54] INTEGRAL RIVET FOR ATTACHMENT OF PARTS INCLUDING AN ANNULAR RECESS

[75] Inventors: Jean-Marie Balandier, Gerardmer; Bernard Remy, Vagney; Daniel Joannes, Thiefosse; Michel Klinger, Stosswihr, all of France

[73] Assignee: SEB S.A., Ecully, France

[21] Appl. No.: 09/128,416

[22] Filed: Aug. 4, 1998

[30] Foreign Application Priority Data

Aug. 4, 1997 [FR] France .................... 97 10172

[51] Int. Cl.$^7$ ........................................ F27D 11/00
[52] U.S. Cl. ................ 219/438; 219/439; 219/542; 219/465.1; 411/504
[58] Field of Search .................. 219/438, 439, 219/429, 430, 436, 536, 542, 552, 553, 530, 540, 465.1; 411/504, 505, 506, 507

[56] References Cited

U.S. PATENT DOCUMENTS

| | | | |
|---|---|---|---|
| 2,321,755 | 6/1943 | Kost | 52/592.3 |
| 2,663,270 | 12/1953 | Friedly | 52/483.1 |
| 3,857,166 | 12/1974 | Galliard | 29/509 |
| 4,136,797 | 1/1979 | Potts | 220/271 |
| 4,138,606 | 2/1979 | Brown | 219/442 |
| 4,223,828 | 9/1980 | Whitley et al. | 232/45 |
| 5,273,385 | 12/1993 | Rose et al. | 411/501 |

FOREIGN PATENT DOCUMENTS 740933  11/1955  United Kingdom .

*Primary Examiner*—Teresa Walberg
*Assistant Examiner*—Shawntina T. Fuqua
*Attorney, Agent, or Firm*—Pillsbury Madison & Sutro

[57] ABSTRACT

Device for attaching together parts of a household electric appliance, one of which parts is a metal assembling part in the form of a sheet or plate having opposed first and second major faces, the device being composed of an assembling and retaining element having a base and a projecting portion which projects beyond the first major face of the assembling part, the assembling and retaining element being integral with, and formed from, said assembling part, wherein the base of the assembling and retaining element is constituted by a portion of the assembling part and extends to a plane containing the second major face of the assembling part, the projecting portion is formed by displacement of material of the assembling part to effect a local reduction of the thickness of the assembling part around the assembling and retaining element, and the projecting portion has a volume corresponding substantially to the volume of the material which is displaced to form the projecting portion. A heating appliance having parts secured together by the device.

13 Claims, 3 Drawing Sheets

INTEGRAL RIVET FOR ATTACHMENT OF PARTS INCLUDING AN ANNULAR RECESS

BACKGROUND OF THE INVENTION

The present invention relates to a device for attachment together of parts of a household electric appliance, at least one of these parts being a metal assembling part in the form of a sheet or plate and having an attachment element projecting from one of the faces of the metal assembling part, the attachment element being formed from the assembling part.

The problem to be resolved is to achieve a sturdy and economical assembly, particularly of an instrument or system, such as a regulator or other part, with an attachment part. The attachment part can be in particular an intermediate part which is in close contact with, and is secured to, by brazing or cementing, a part constituting a wall of a household electric appliance.

No rivet mark may appear on this wall, which must remain fluid tight. Such a wall can notably be that of a tank of an electric boiler or coffee maker, a fryer tank, a steam generator, a clothes pressing iron, a surface cleaner, a water or steam cooker, etc.

The present invention is thus particularly applicable to appliances for heating food where an intermediate part is an aluminum sheet in contact with a stainless steel sheet. The aluminum sheet must distribute the heat dissipated by a heating resistance toward the stainless steel sheet, the latter having a larger surface and being in contact with the food. Stainless steel or another material having comparable properties is selected because it is inert with respect to food with which it is in contact, is resistant to corrosion and scale, is able to withstand mechanical and chemical corrosion, and has an attractive appearance. Use can also be made of a steel sheet coated with a polymer that is compatible with food, for example PTFE, or with any other chemically or electrically applied layer, such as gold, nickel, etc.

Attachment devices that have already been proposed in the art include those in which rivets are obtained by deformation of one of the assembling sheets itself. For this purpose, a projection is formed at the surface of the sheet either by extrusion of a portion of this sheet in a matrix presenting a negative version of the form of the part intended to constitute the rivet, or by semi-stamping of the sheet, or even by localized drawing of the sheet in a die with the aid of a stamp whose diameter is smaller than that of the die.

To attach a part with the aid of such a device, the projecting part of the rivet can be introduced into an opening in the part to be attached, with the axial length of the opening being smaller than the length of this projecting part, followed by deforming, i.e., riveting or crimping, the part of the rivet which extends out of the opening of the part to be attached so as to join the two parts together.

The base of such an integrated rivet is necessarily set back from the level of the support surface of the part in which this rivet has been formed, the support surface of this part corresponding to the face that is opposed to that from which the rivet projects. It is thus not possible to exert on the free surface of this rivet the pressure necessary for crimping, without coming to bear against the withdrawn base of this rivet. As a result, the material of the rivet will be at least partially driven back into the part with which this rivet is integrated; instead of being crimped around the opening of the part to the attached. As a result, it becomes difficult, or even impossible, to obtain an attachment with the desired resistance to pulling apart. This risk of driving back the material of the rivet is that much greater when the material from which the rivet is made is malleable, such as aluminum or particularly copper.

There exist situations in which it is not possible to reach the withdrawn base of the integrated rivet, or in which it is necessary that the support surface of the part in which the integrated rivet is formed not be damaged by the formation of an integrated rivet of the type described above. There also exist cases in which, due to the lack of room above the rivet, it is not possible to utilize a crimping driver which is driven with an oscillating movement, or a driver whose diameter exceeds the diameter of the rivet by more than around 1 mm. Consequently, the head of the rivet can only be produced by a straight line pressing movement and a flat or slightly conical driver. Now, the holding force of the attachment is given by the volume of the rivet head, which is the reason why it is important that the latter not be capable of being pushed back under the effect of the driver pressure, since in this case its volume will be correspondingly reduced to the detriment of the holding strength of the attachment.

There is another factor which must also be taken into account. Given inevitable fabrication tolerances and the fact that, in general, several rivets are necessary to attach two parts together, it is necessary to provide a rivet diameter which is substantially smaller than that of the opening engaged by this rivet. Consequently, during crimping, the volume of the rivet must allow the gaps between the rivet and the opening to be filled and to form a rivet head having a sufficiently large volume. If the cross section of the rivet is smaller than that of the opening engaging the rivet, the rivet volume is thus reduced in such a manner that in order to compensate for this volume reduction, it is necessary to increase the length of the rivet. The difficulty of achieving this increases as the thickness of the base sheet in which the rivet is formed is reduced.

The Patent document FR-258 1571 discloses a process for closing a steam chamber of a steam iron according to which the closing cover of this chamber is pressed on the body of the ironing soleplate with a pressure sufficient to extrude the material of the cover into recesses arranged in the soleplate. Given that the cross section of these recesses is trapezoidal, this cover is permanently fixed in a sealed manner to the ironing soleplate. This attachment is not a riveting and is not practically usable for the type of assemblage that is of interest in connection with the present invention. That publication only discloses an attachment obtained by extrusion of the part to be attached in a recess of the other part to be attached.

BRIEF SUMMARY OF THE INVENTION

A primary object of the present invention is to remedy, or at least reduce, the above-mentioned shortcomings, in a manner to permit an attachment by means of an integrated rivet permitting crimping of the rivet or rivets with the aid of a support surface not having any raised part.

The above and other objects are achieved, according to the present invention, by a device for attaching together parts of a household electric appliance, one of which parts is a metal assembling part in the form of a sheet or plate having opposed first and second major faces, the device comprising: an assembling and retaining element having a base and a projecting portion which projects beyond the first major face of the assembling part, the assembling and retaining element being integral with, and formed from, the assembling part, wherein the assembling and retaining element has a base which is constituted by a portion of the assembling part and which extends toward a plane containing the second major face of the assembling part, the projecting portion is formed by displacement of material of the assembling part, obtained by a local reduction of the thickness of the assembling part around the base and/or the side of the projecting portion of the assembling and retaining element, and the projecting portion has a volume corresponding substantially to the volume of the material which is displaced to form the projecting portion.

Contrary to the integrated rivets according to the prior art, the base of a rivet according to the present invention is located at the same level as the lower face of the sheet or plate, the projecting part of this rivet being formed by extrusion, or cold flow, of the surrounding material of this sheet or plate. As will be seen, the length of this projecting part of the rivet can correspond to several times the thickness of the sheet or plate from which the projecting part of this rivet is formed. During crimping of this rivet, its base is located at the level of the side of the sheet which faces away from the projecting part of the rivet so that, during crimping, the reverse side of this sheet can come to bear against a flat surface in order to produce deformation of the rivet to form the head which is intended to secure the part that is placed on the part with which the rivet is integrated.

In the case where it is desired, according to the invention, to maintain intact the face of the sheet or plate forming the reverse side with respect to the rivet, the local reduction of the thickness around the base and around the side of the assembling and retaining element defines an annular zone situated at the side of the part from which projects the assembling and retaining element. Thus, not only is the base of the rivet at the same level as the face corresponding to the reverse side, but this face does not carry any other visible mark of the presence of a rivet from the other side, except possibly for a circular groove having a depth of around 0.2 mm, formed by the die, as well as a very small cone whose diameter corresponds to approximately one tenth of the diameter of the rivet. These marks however do not affect the strength of the rivet at the time of its flattening.

When the displacement of the material that permits creation of the projecting part of the assembling and retaining element originates at a zone situated at the base of this element and from the side from which this element projects, i.e. from the side of the part to be attached by the integrated rivet to the metal assembling part, it can be useful to provide bearing means between the periphery of the zone situated at the base of the assembling and retaining element and the projecting part of the rivet in order to avoid deformation into the annular zone of the part to be attached during crimping of the rivet on that part. These bearing means can have various forms, such as that of a part on the projecting part of the rivet, or radial ribs distributed angularly around the rivet at the level of the annular zone, or even a washer, or ring. These bearing means will preferably be disposed in such a manner that their upper face is coplanar with the adjacent face of the part carrying the integrated rivet. During crimping of the rivet, these bearing means assure avoidance of deformation of the part on which the rivet head is formed in order to attach it to the other part.

To facilitate formation of the rivet by extrusion during a cold forming operation, this operation is performed to give the bottom of the annular zone a form which slopes downwardly from the base of the rivet to the periphery of this annular zone. This inclination allows creation, during movement of the rivet-forming press along the axis of the rivet, of a centripetal force component on the material, thus directing the material of the sheet or of the plate toward the center where the imprint of the formation of the projecting part of the rivet is found.

DETAILED DESCRIPTION OF THE INVENTION

Figure 1:
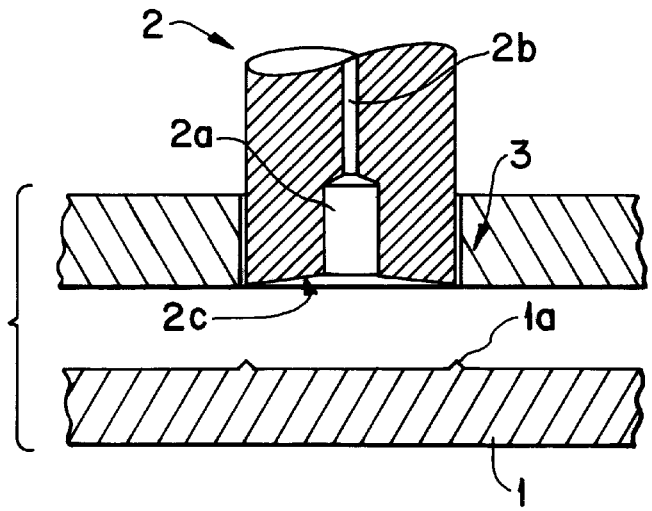
FIG. 1 is a cross-sectional view of one arrangement for producing a rivet integrated with one of the parts of the attachment device according to the invention.

FIG. 1 illustrates one embodiment of a tool that is to be used to produce an integrated rivet by cold deformation, or forming, of a sheet, for example a sheet of aluminum. The resulting structure is intended to be an assembling and retaining element in accordance with the present invention. This tool includes a matrix, or die, 1, a punch, or stamp, 2 and a clamping disk 3. Matrix 1 has a projecting annular rib 1a for holding the material of the sheet to be deformed. The diameter of rib 1a is slightly greater than the outer diameter of punch 2. Punch 2 has a cylindrical recess 2a intended to form the assembling and retaining element of the rivet. The upper end, or base, of recess 2a communicates with an air exhaust hole 2b. The lower end 2c of punch 2 has the form of a right circular cone which, in the illustrated example, opens at an angle of 156°. The diameter of cylindrical recess 2a in this example is of the order of 2.5 mm, while the outer diameter of punch 2 is of the order of 8 mm and the inner and outer diameters of annular rib 1a are 9 and 10 mm, respectively.

Figure 2:
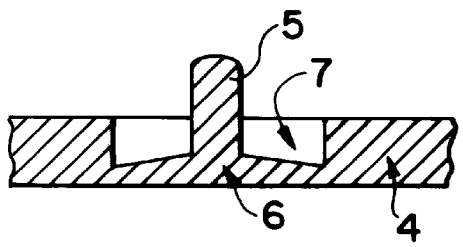
FIG. 2 is a cross-sectional view of a rivet obtained by operation of the arrangement shown in FIG. 1.

Referring to FIG. 2, an aluminum sheet 4 used to form the metal assembling part in which an integrated rivet has been formed by cold forming, using the tool shown in FIG. 1, is, by way of a non-limiting example, a sheet made of a 1200 series aluminum having an initial thickness of 1.5 mm. The rivet thus formed includes an assembling and retaining element 5 that projects upwardly from a base 6 located in an annular recess 7 created by cold flow of the material of the initially planar sheet 4 into element 5 during the cold forming. The lowest point of recess 7 extends to a level close to the lower face of sheet 4, which is the face opposite to that from which element 5 projects. In this example, the height of element 5 above the upper face of sheet 4 is of the order of 2 to 4 mm.

The press (not shown) utilized to create this integrated rivet can be a geared press which can exert on stamp 2 a force of the order of $7 \times 10^4$N while a force that can be of the order of $10^4$N is exerted on element 3. Preferably, use will also be made of a lubricant suitable for this pressing operation and stamp 2 will be made of a hard material whose working surfaces are mirror polished. Element 3, annular rib 1a and conical face 2c all cooperate to direct material within sheet 4 into recess 2a in order to promote the formation of a rivet element 5 which has the greatest possible height.

Depending on the geometry of the parts to be assembled and their environment, different arrangements can be produced as illustrated in FIGS. 3 to 8.

Figure 3:
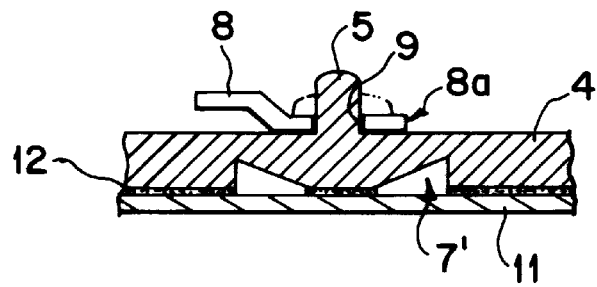
FIGS. 3–11 are cross-sectional views of nine forms of construction of nine embodiments of attachment devices according to the invention, prior to crimping of the rivet.

The example illustrated in FIG. 3 is a variant according to which the recess 7', which is formed by a flow of material to create element 5, extends from the face of sheet 4 which is opposite to that from which element 5 projects. An annular configuration of this recess 7' produces the result that the part of sheet 4 which constitutes the base of the rivet extends to the level of the face of sheet 4 which is opposite to the face from which element 5 projects. A part 8 to be attached is then positioned on element 5 by passage of element 5 through a hole 9 preliminarily formed in part 8. With the arrangement shown in FIG. 3, there is no risk that part 8 will be deformed into recess 7' during crimping of the free end of element 5. The head of element 5 after crimping is shown in broken lines.

Figure 4:
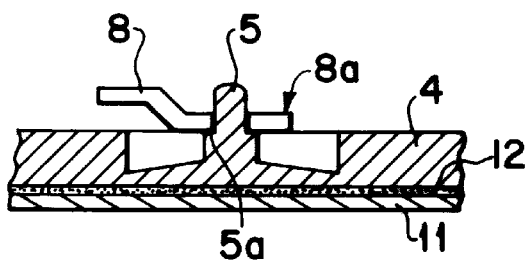

The variant illustrated in FIG. 4 permits achievement of the same result by providing a supporting surface 5a located at the base of rivet element 5, at the level of the upper face of metal assembling part 4. This supporting surface 5a is produced by giving the recess 2a formed in stamp 2 an appropriate configuration. The part 8 to be attached is then retained on support surface 5a which prevents it from sinking into recess 7 so that once the head of the rivet has been formed by pressing or hammering on the upper end of element 5 situated beyond part 8, this part 8 is retained between the resulting rivet head and the support surface 5a.

Figure 5:
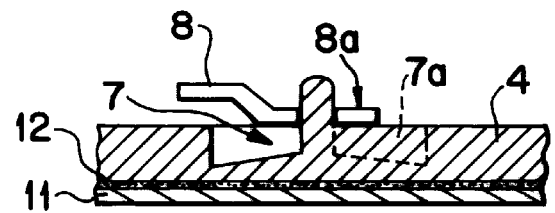

According to the variant shown in FIG. 5, radial ribs 7a are located within cavity 7 and integral with sheet 4. Ribs 7a have upper edges that are coplanar with the upper face of sheet 4. Three such ribs 7a may be provided and are preferably distributed uniformly around the circumference of recess 7. Similar to the embodiments of FIGS. 3 and 4, ribs 7a prevent part 8 from sinking or being driven into recess 7 during the crimping operation which deforms the upper end of element 5 to form a rivet head. Here again, ribs 7a are created by providing appropriate notches in the lower end of stamp 2.

Figure 6:
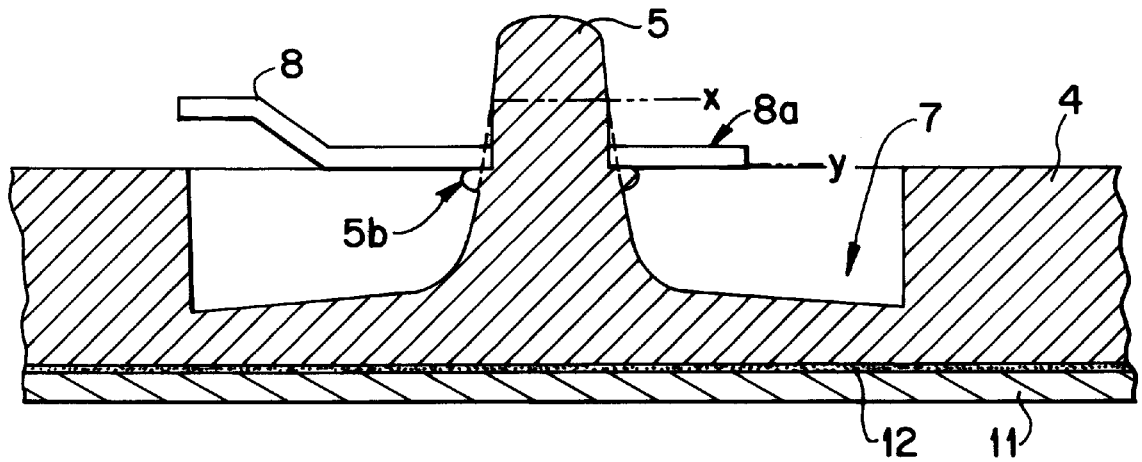

Instead of forming the support surface 5a shown in FIG. 4 by suitably shaping recess 2a in stamp 2, it is possible to create an abutment 5b, as shown in FIG. 6, by reworking element 5 after the initial cold flow formation of this element. Specifically, the shank of element 5 can initially be given a substantially conical form, and the hole in part 8 can be appropriately dimensioned so that when part 8 is forced down over element 5, a chip which adheres to element 5 will be formed as part 8 is forced downwardly from level x to level y. While this chip is being formed, the shank of element 5 is being shaped to mate perfectly with the hole in part 8 and the abutment 5b is formed. It is necessary, for this embodiment, that the diameter of the hole in part 8 be appropriately selected, and at least be between the minimum and maximum diameters at the upper and lower ends of element 5. In the embodiment of FIG. 6, the diameter of element 5 is greater than the diameter of the hole in part 8 between the level x and the base of element 5 in order to permit the generation of such a chip.

In all of the variants described thus far, the portion of the flat surface 8a of part 8 surrounding hole 9 was smaller than the cross section of the annular recess 7. Therefore, in the case of these embodiments, the flat surface portion 8a could not be maintained at the level of the upper surface of sheet 4 without providing an abutment or other appropriate retaining element.

Figure 7:
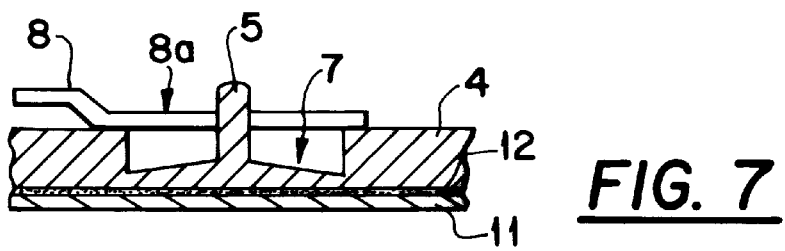

The variant illustrated in FIG. 7 eliminates this deficiency by giving part 8 a form such that the flat surface 8a surrounding hole 9 has a surface area larger than the cross-sectional area of recess 7, so that a peripheral edge portion of surface 8a can bear against a portion of the upper surface of sheet 4 which surrounds recess 7. However, with this variant, there is a danger that the rivet will be driven back underneath surface 8a. Although the thickness of the steel sheet constituting part 8 helps to prevent deformation of the sheet, there is nothing to prevent, even in this case, complementary utilization of one of the variants of FIG. 4 to 6 in order to reinforce the base of the rivet and prevent it from being pushed back.

Figure 8:
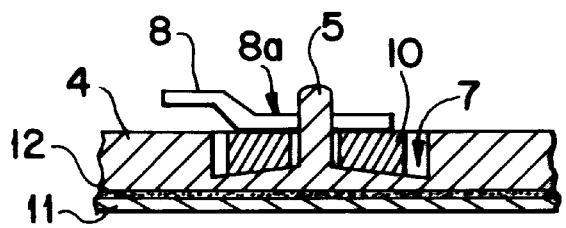
Figure 9:
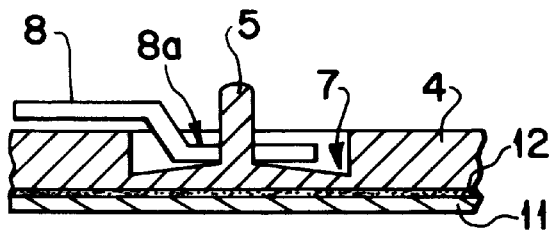

Finally, as another variant of FIGS. 4 to 6 in particular, also capable of being combined with the variant of FIG. 7, it is possible to simply place a ring or washer 10 in annular cavity 7, as shown in FIG. 8. Preferably, washer 10 has a lower face with a conical form configured to mate with the base of recess 7, while the upper face of washer 10 is coplanar with the upper face of sheet 4. The variants illustrated in FIGS. 9–11 also permit avoidance of the risk of pushing back of the rivet under portion 8a of part 8. In the variant shown in FIG. 9, instead of giving portion 8a a larger diameter, as in the case of the variant of FIG. 7, this part is given a form, similar to the variants of FIGS. 3–6, so that it can enter into recess 7 and come to bear against the base of element 5, thereby avoiding any risk that element 5 will be pushed back under portion 8a.

Figure 10:
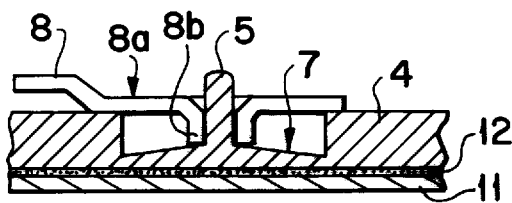

In the variant illustrated in FIG. 10, the hole in part 8 intended to engage around element 5 has a tubular portion 8b with an axial length corresponding to the depth of the portion of element 5 below the level of the face of aluminum sheet 4 in which recess 7 has been formed. Thus, portion 8a of part 8 is situated at the level of this upper face of aluminum sheet 4.

Tubular portion 8b surrounds the lower part, or base, of element 5 and thus eliminates any risk of pushing back material from element 5 during crimping.

Figure 11:
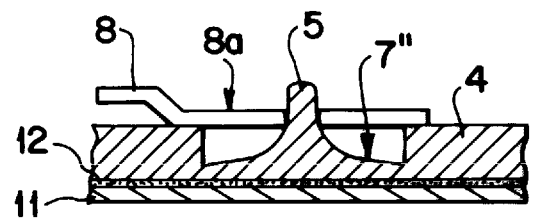

Finally, FIG. 11 shows that the cross-section of element 5 can increase progressively below the level of the edge of recess 7", thereby avoiding any risk of pushing back of material forming part of element 5.

Among other variants envisioned, it can be mentioned that the cross-sectional shape of element 5 is not necessarily circular, but can also be of another form, such as, for example, square, cruciform, rectangular, or any other appropriate form, particularly if it is desired to position part 8 with a particular angular orientation relative to the longitudinal axis of element 5.

Figure 13A:
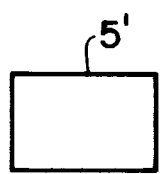
FIGS. 13A, 13B and 13C are end views of three forms of construction of an element of a device according to the invention.
Figure 13B:
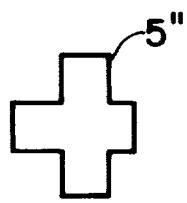
Figure 13C:

For example, FIG. 13A shows an element 5' having a rectangular cross section, FIG. 13B shows an element 5" having an asymmetrical cruciform cross section and FIG. 13C shows an element 5''' having an oval or elliptical cross section. Each of these elements will be assembled to a plate 8 having a hole with a mating cross section. A plate 8 can be assembled with element 5' or 5''' in either one of two orientations but can have only one orientation when assembled with part 5".

As can be seen from FIGS. 3 to 8, the lower face of the metal attachment part formed from sheet 4 can be associated with a second sheet 11, for example made of stainless steel, attached to sheet 4 by, for example, a brazing layer 12. This sheet 11 is preferably intended to form an enclosure of a water boiler, or a heating bottom of a boiler used for the preparation of food. For this purpose, an electric heating resistance is brazed onto aluminum plate 4.

Figure 12:
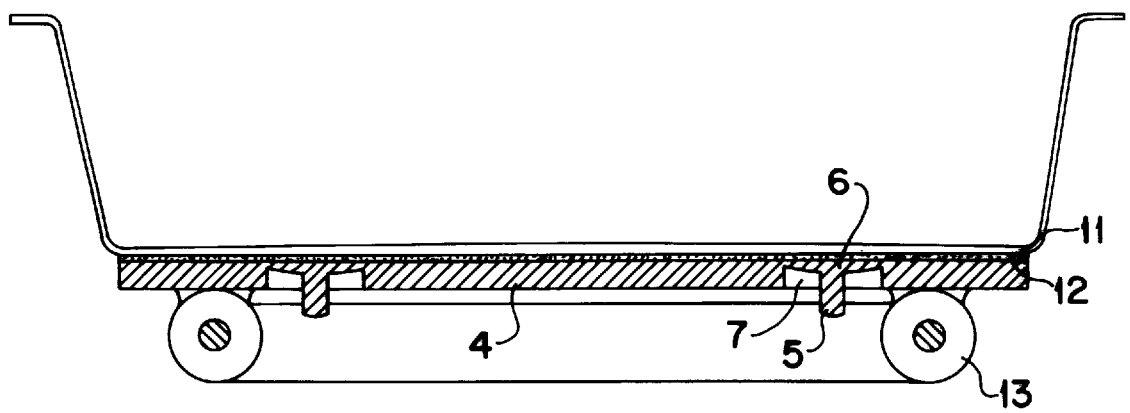
FIG. 12 is an elevational, cross-sectional view showing a heating base of a water boiling appliance having parts attached together in accordance with the invention.

FIG. 12 shows such a heating bottom for a boiler comprising an electric heating resistance 13 assembled onto a sheet 4 having a high thermal conductivity and having the shape of a circular disk. Sheet 11 is attached to the bottom of a container, such as a pot or tank, for example. Sheet 4 is provided with several attachment devices according to the present invention.

It should additionally be noted that brazing of the stainless steel sheet 11 to sheet 4 also serves to strengthen aluminum sheet 4. While there is a risk that the relatively small thickness of sheet 4 at the bottom of recess 7 may unduly weaken the strength of the resulting assembly, this danger can be avoided by brazing a stainless steel sheet 11, having a thickness of, for example, 0.5 mm to sheet 4.

The attachment device according to the present invention is thus useful, advantageously although not exclusively, in the fabrication of small household appliances. Among the possible uses envisioned, mention can be made of the assemblage of a controller for the enclosed electric heating resistance of a boiler where several integrated rivets of the type described above and formed in aluminum part 4 assure immoveable attachment of the controller and at the same time good thermal conduction between this controller and the aluminum part.

Assembling devices according to the present invention are inexpensive to fabricate, durable and reliable, even in the case of thin sheets and rivets having small diameters. For the type of use mentioned hereabove by way of example, in which metal assembling part 4 also constitutes a heat diffuser, aluminum is a particularly desirable material since it combines the properties of ease of deformability with high thermal conductivity. Depending on the specific application envisioned, metals other than aluminum can obviously be selected.

Another important advantage of the assembling device according to the invention resides in the fact that the resulting rivets do not present any risk of cracking, contrary to the situation presented by rivets of the type known in the art. There is thus formed a completely sealed barrier between the face which is brazed to steel sheet 11 and the face at which part 8 is attached. This eliminates any risk of flow of brazing flux by capillarity from brazing layer 12 into the region where the rivets connect a part to sheet 4. Such a flow would form a solid residue which is nearly incompressible in response to the crimping forces and would thus modify the side where parts are attached by means of the rivets. Moreover, in the case of a boiler whose temperature is controlled by a bimetal, a brazing flux which could flow by capillarity to the other face of sheet 4 could also interfere with functioning of a bimetal, which rests on the sheet 4 serving as a heat diffuser, between the attachment devices. This application relates to subject matter disclosed in French Application Number 97 10172, filed on Aug. 4, 1997, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. Device for attaching together parts of a household electric appliance, one of which parts is a metal assembling part in the form of a sheet or plate having opposed first and second major faces, said device comprising:
    an assembling and retaining element having a base and a projecting portion which projects beyond the first major face of the assembling part, said assembling and retaining element being integral with, and formed from, said assembling part, wherein
    said base of said assembling and retaining element is constituted by a portion of said assembling part and extends toward a plane containing the second major face of the assembling part,
    said projecting portion is formed by displacement of material of the assembling part to effect a local reduction of the thickness of the assembling part around the assembling and retaining element, and
    said projecting portion has a volume corresponding substantially to the volume of the material which is displaced to form said projecting portion.

2. Device according to claim 1 wherein the local reduction of the thickness of the assembling part occurs around the base and the projecting portion of the assembling and retaining element and produces an annular recess extending from the first major face of the metal assembling part.

3. Device according to claim 1 wherein the local reduction of the thickness of the assembling part occurs around the base of the assembling and retaining element and produces an annular recess adjacent the second major face of the metal assembling part.

4. Device according to claim 1 wherein said assembling and retaining element is formed to have a support surface surrounding said projecting portion and lying in a common plane with the first major face of the metal assembling part.

5. Device according to claim 2 wherein said assembling and retaining element further comprises a plurality of ribs extending radially outwardly from said projecting portion across said annular recess, said ribs having outer edges which lie in a common plane with the first major face of the metal assembling part.

6. Device according to claim 2, further comprising an annular element disposed in the annular recess and having a face which lies in a common plane with the first major face of the metal assembling part.

7. Device according to claim 2 wherein the annular recess has a bottom which is inclined radially outwardly in a direction toward the second major face of the metal assembling part.

8. Device according to claim 1 wherein said projecting portion of said assembling and retaining element has a non-circular cross-section which is shaped to receive an opening in a second one of the parts of the household electric appliance when the second one of the parts has a given angular orientation.

9. Device according to claim 1 wherein the metal assembling part is made of aluminum.

10. Device according to claim 1 further comprising a sheet of stainless steel brazed to the second major face of the metal assembling part.

11. A heating appliance comprising:
    a receptacle for holding a product to be heated, said receptacle having a bottom;
    a metal assembling part in the form of a sheet or plate having opposed first and second major faces, said second major face being secured to said receptacle bottom and said metal assembling part comprising:

an assembling and retaining element having a base and a projecting portion which projects beyond the first major face of the assembling part, said assembling and retaining element being integral with, and formed from, said assembling part, wherein said base of said assembling and retaining element is constituted by a portion of said assembling part and extends toward a plane containing the second major face of the assembling part, said projecting portion is formed by displacement of material of the assembling part to effect a local reduction of the thickness of the assembling part around the assembling and retaining element, and said projecting portion has a volume corresponding substantially to the volume of the material which is displaced to form said projecting portion; and a resistance heating assembly attached to said metal assembling part by means of said assembling and retaining element.

12. A device according to claim 1 wherein said base of said assembling and retaining element is at the same level as the second major face of the assembling part when said device is attached to another part of the household electric appliance.

13. A device according to claim 12 wherein said base of said assembling and retaining element is substantially flat at the level of the second major face of the assembling part when said device is attached to another part of the household electric appliance.

* * * * *